(12) United States Patent
Kim (10) Patent No.: US 9,990,974 B2
(45) Date of Patent: Jun. 5, 2018

(54) MEMORY SYSTEM HAVING ADDRESS SYNCHRONIZER AND OPERATION METHOD THEREOF

(71) Applicant: SK hynix Inc., Gyeonggi-do (KR)

(72) Inventor: Min-Su Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 100 days.

(21) Appl. No.: 15/165,730

(22) Filed: May 26, 2016

(65) Prior Publication Data

US 2017/0133068 A1    May 11, 2017

(30) Foreign Application Priority Data

Nov. 10, 2015  (KR) .................. 10-2015-0157328

(51) Int. Cl.
  *G11C 7/22* (2006.01)
  *G11C 7/10* (2006.01)
  *G06F 13/16* (2006.01)

(52) U.S. Cl.
  CPC ............ *G11C 7/222* (2013.01); *G11C 7/1066* (2013.01); *G11C 7/1072* (2013.01); *G06F 13/1689* (2013.01)

(58) Field of Classification Search
  CPC ... G11C 7/1066; G11C 7/1072; G11C 7/1087; G11C 7/109; G11C 7/1093; G11C 7/1096; G11C 7/22; G11C 7/222; G11C 7/225; G06F 1/12; G06F 13/1689; G06F 13/4234
  USPC ........ 711/105, 167, 217, 218; 713/400, 401; 327/261, 264, 401, 57
  See application file for complete search history.

(56) References Cited

U.S. PATENT DOCUMENTS

| | | | | |
|---|---|---|---|---|
| 4,734,880 A | * | 3/1988 | Collins | G11C 7/22 365/193 |
| 5,452,261 A | * | 9/1995 | Chung | G11C 7/1018 365/221 |
| 7,278,044 B2 | * | 10/2007 | Song | G06F 1/06 711/167 |
| 7,609,565 B2 | | 10/2009 | Lee | |
| 2012/0170394 A1 | * | 7/2012 | Kim | G11C 8/04 365/200 |

FOREIGN PATENT DOCUMENTS

KR    1020090044135    5/2009

OTHER PUBLICATIONS

Lin, C.. "Introduction to Flip Flops: D and T", Summer 2003, hosted by the Computer Science Department of the University of Maryland (Year: 2003).*

(Continued)

*Primary Examiner* — Reginald G Bragdon
*Assistant Examiner* — Aaron D Ho
(74) *Attorney, Agent, or Firm* — IP & T Group LLP (57) ABSTRACT

An address generation device of a memory system includes an address generator and a synchronizer. The address generator may receive a clock and sequentially generate a first address and a second address after the first address. The synchronizer may synchronize the first address in response to the clock at a preset time point before the second address is generated by the address generator, and output the synchronized address as an output address.

13 Claims, 7 Drawing Sheets

(56) References Cited

OTHER PUBLICATIONS

Neuberger, G., Wirth, G., Reis, R., "Protecting Chips Against Hold Time Violations Due to Variability", 2014, Springer Science+Business Media, ISBN: 978-94-007-2427-3, pp. 15-19, 91-104 (Year: 2014).*

Wang, H., "Timing Issues in FPGA Synchronous Circuit Design", Spring 2013, hosted by Southern Illinois University at Carbondale's College of Engineering (Year: 2013).*

Black-Schaffer, D., "Lecture 5: Timing", Spring 2003, hosted by Stanford University (Year: 2003).*

Heon-Cheol Kim, Dong-Soon Yi, Jin-Young Park and Chang-Hyun Cho, "A BISR (built-in self-repair) circuit for embedded memory with multiple redundancies," VLSI and CAD, 1999. ICVC '99. 6th International Conference on, Seoul, 1999, pp. 602-605.doi: 10.1109/ICVC.1999.821012 (Year: 1999).*

\* cited by examiner

MEMORY SYSTEM HAVING ADDRESS SYNCHRONIZER AND OPERATION METHOD THEREOF

CROSS-REFERENCE TO RELATED APPLICATIONS

The present application claims priority of Korean Patent Application No. 10-2015-0157328, filed on Nov. 10, 2015, which is incorporated herein by reference in its entirety.

BACKGROUND

1. Field

Exemplary embodiments of the present invention relate to a memory system, and more particularly, an interface of a memory system.

2. Description of the Related Art

Recently, a data processing system using an electronic device such as a desktop computer as well as a portable electronic device such as a smart phone or tablet personal computer (PC) have been required to process the data at high speed. According to such a trend, an interface of a memory device, for example, a NAND flash memory, included in a data processing system has been gradually improved in operating speed.

SUMMARY

Various embodiments are directed to a device and method for generating an address used in a memory system for a high-speed operation.

Various embodiments provide an address generation device and method for reducing power consumption in a memory system.

Various embodiments provide an address generation device and method for improving a chip size in a memory system.

In an embodiment, an address generation device of a memory system may comprise an address generator suitable for sequentially generating a first address and a second address based on a clock; and a synchronizer suitable for synchronizing the first address in response to the clock at a preset point in time before the second address may be generated by the address generator to output an output address. The address generator may include an address unit suitable for generating the first address and the second address in response to the clock; an address delay unit suitable for delaying the second address to generate a third address; and a repair detector suitable for detecting whether the second address may be a repair address to generate a detection signal. The synchronizer may include a first flip-flop suitable for latching the third address in response to the clock to output the latched address as the output address. The synchronizer may further include a second flip-flop suitable for latching the detection signal in response to the clock to output a repair enable signal. The preset point in time may be set as much as a hold time of the first flip-flop before the second address may be generated. The clock may include a source clock for data output of the memory system. The first flip-flop may include a D flip-flop.

In an embodiment, a method for generating an address in a memory system, the method may comprise sequentially generating a first address and a second address based on a clock; and synchronizing the first address in response to the clock at a preset point in time before the second address may be generated to output an output address. The method may further comprise delaying the second address to generate a third address; and detecting whether the second address may be a repair address. The preset time may be set as much as a hold time of a flip-flop before the second address may be generated, the flip-flop being used for the synchronizing of the first address. The address generation method may further comprises outputting a repair enable signal corresponding to a result of the detecting. The clock may include a source clock for data output of the memory system.

In an embodiment, a memory system may comprise a memory device storing data and including an address generation device suitable for generating an address for outputting the stored data; and a controller suitable for controlling an operation of the memory device, and supplying a clock to the memory device; wherein the address generation device comprises: an address generator sequentially generating a first address and a second address based on a clock; and a synchronizer suitable for synchronizing the first address in response to the clock at a preset point in time before the second address may be generated by the address generator to output an output address. The address generator may include an address unit suitable for generating the first address and the second address in response to the clock; an address delay unit suitable for delaying the second address to generate a third address; and a repair detector suitable for detecting whether the second address may be a repair address to generate a detection signal. The synchronizer may include a first flip-flop suitable for latching the third address in response to the clock to output the latched address as the output address. The preset point in time may be set as much as a hold time of the first flip-flop before the second address may be generated. The synchronizer may further comprises a second flip-flop suitable for latching the detection signal in response to the clock to output a repair enable signal. The first flip-flop may include a D flip-flop.

DETAILED DESCRIPTION

Hereafter, various embodiments of the present invention will be described below in more detail with reference to the accompanying drawings. The following descriptions will be focused on components required for promoting understanding of operations in accordance with the embodiments of the present invention, and the descriptions of the other components will be omitted in order not to obscure the purpose of the present invention. Furthermore, the terms used in this specification are defined in consideration of functions of the embodiments of the present invention, and may be changed according to the customs or intention of a user or operator. Thus, the definition must be based on the overall specification.

The present invention may, however, be embodied in different forms and should not be construed as limited to the embodiments set forth herein. Rather, these embodiments are provided so that this disclosure will be thorough and complete, and will fully convey the scope of the present invention to those skilled in the art. Therefore, FIGS. 1 to 5B which are used to describe the principles of the present invention in this specification are only examples, and do not limit the scope of the present invention. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 1:
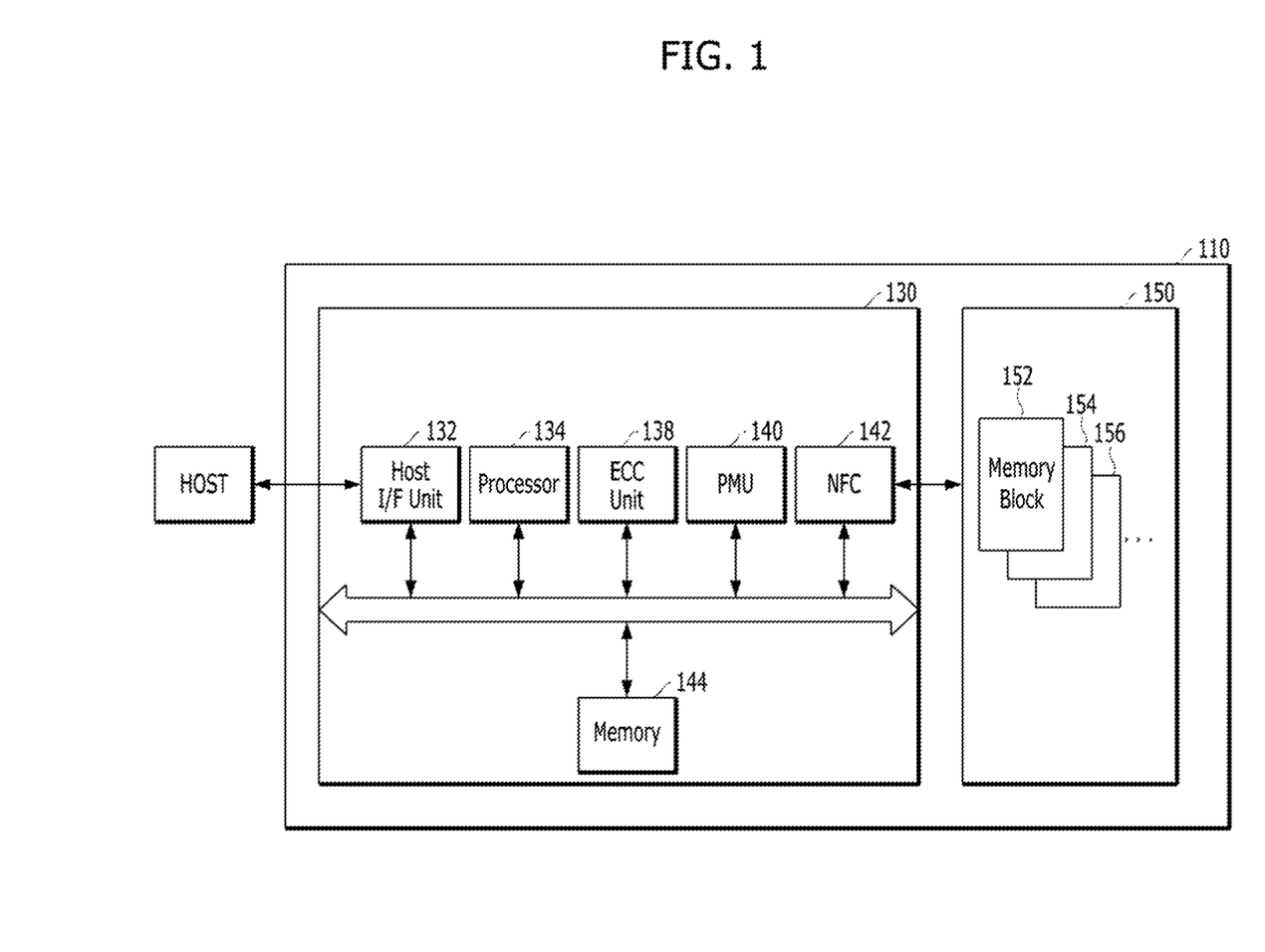
FIG. 1 is a diagram illustrating a memory system in accordance with an embodiment.

FIG. 1 is a block diagram illustrating a memory system 110 in accordance with an embodiment.

Referring to FIG. 1, the memory system 110 may form a data processing system along with a host, for example, a portable electronic device such as a mobile phone, an MP3 player and a laptop computer or an electronic device such as a desktop computer, a game player, a TV and a projector.

The memory system 110 may operate in response to a request from the host, and in particular, store data to be accessed by the host. In other words, the memory system 110 may be used as a main memory system or an auxiliary memory system of the host. The memory system 110 may be implemented with any one of various kinds of storage devices, according to the protocol of a host interface to be electrically coupled with the host. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host, and a controller 130 which may control storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host that is electrically coupled with the memory system 110 may be significantly increased.

The controller 130 and the memory device 150 may be integrated into one semiconductor device to form a memory card. The controller 130 and the memory device 150 may be integrated into one semiconductor device and configure a memory card such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host during a write operation, and provide stored data to the host during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail.

The controller 130 of the memory system 110 may control the memory device 150 in response to a request from the host. The controller 130 may provide the data read from the memory device 150, to the host, and store the data provided from the host into the memory device 150. To this end, the controller 130 may control overall operations of the memory device 150, such as read, write, program and erase operations.

In detail, the controller 130 may include a host interface (I/F) unit 132, a processor 134, an error correction code (ECC) unit 138, a power management unit (PMU) 140, a NAND flash controller (NFC) 142, and a memory 144.

The host interface unit 132 may process commands and data provided from the host, and may communicate with the host through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host. The NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110, and store data for driving the memory system 110. The controller 130 may control the memory device 150 in response to a request from the host. For example, the controller 130 may provide the data read from the memory device 150 to the host and store the data provided from the host in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 110, and thus reliable bad block management is required.

Figure 2:
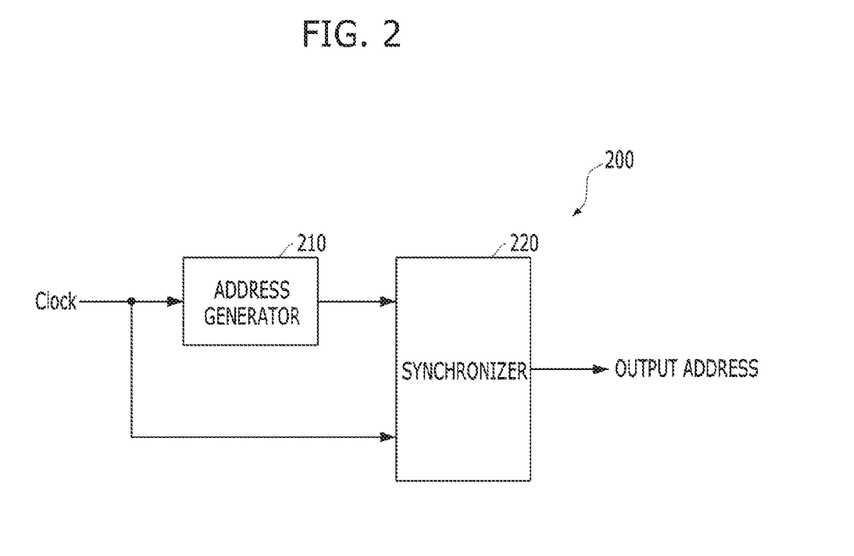
FIG. 2 is a block diagram illustrating an address generation device in accordance with an embodiment of the present invention.

FIG. 2 is a block diagram of an address generation device 200 in accordance with an embodiment of the present invention. The address generation device 200 may be included in the memory device 150 illustrated in FIG. 1.

Referring to FIG. 2, the address generation device 200 may include an address generator 210 and a synchronizer 220. The address generator 210 may receive a clock, and generate an address in response to the clock. The address generator 210 may generate a first address, and sequentially generate a second address after the first address is generated. The clock may include a clock for data output of the memory device 150. For reference, the clock may be supplied from the controller 130 shown in FIG. 1.

The synchronizer 220 may receive the clock and the address generated by the address generator 210, synchronize the address in response to the clock, and output the synchronized address as an output address. The synchronizer 220 may synchronize the first address in response to the clock at a preset point in time before the second address is generated by the address generator 210, and output the synchronized address as an output address. For example, when the synchronizer 220 is implemented with a flip-flop, the preset point in time may be set as much as a hold time of a flip-flop before the second address is generated.

Figure 3A:
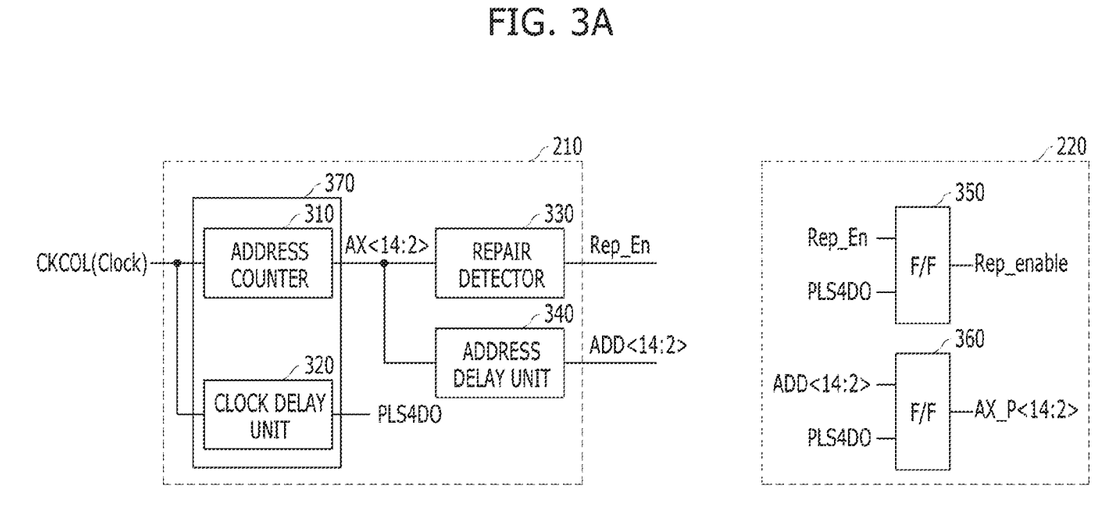
FIG. 3A is a diagram illustrating an address generation device.
Figure 4A:
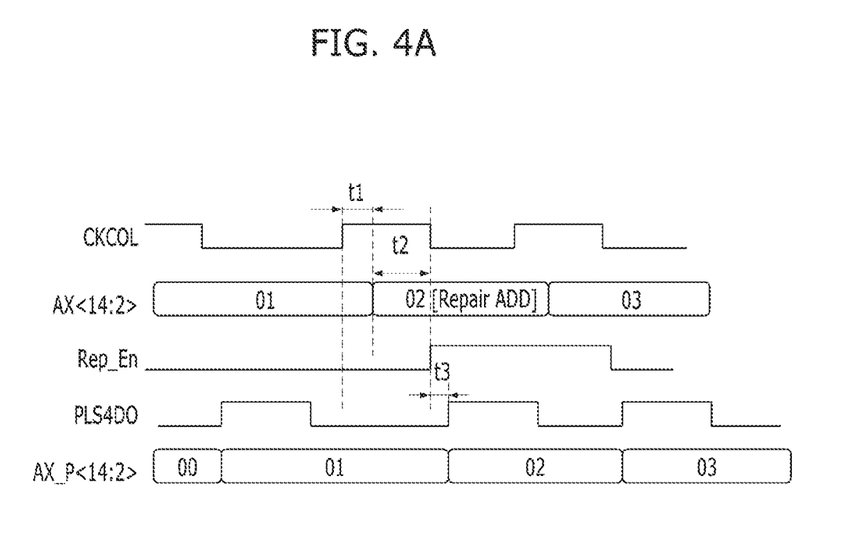
FIG. 4A is a timing diagram for describing an operation of the address generation device shown in FIG. 3A.

FIG. 3A is a diagram illustrating an address generation device. FIG. 3A shows a detailed configuration of the address generation device 200 illustrated in FIG. 2. FIG. 4A is a timing diagram for describing an operation of the address generation device illustrated in FIG. 3A.

Referring to FIG. 3A, the address generator 210 may include an address unit 370, a repair detector 330, and an address delay unit 340, and the synchronizer 220 may include a first flip-flop (F/F) 350 and a second F/F 360.

The address unit 370 includes an address counter 310 and a clock delay unit 320. The address counter 310 may perform a counting operation in response to a clock CKCOL, and generate an address AX<14:2> corresponding to the counting operation.

The clock delay unit 320 may delay the clock CKCOL, and output the delayed clock PLS4DO. The delayed clock PLS4DO may be used as a source clock for outputting data stored in the memory device 150 of FIG. 1.

The repair detector 330 may receive the address AX<14:2> generated by the address counter 310, and detect (or evaluate) whether the address AX<14:2> is a repair-related address. The repair detector 330 may output the detection result as a detection signal Rep_En.

The address delay unit 340 may receive the address AX<14:2> generated by the address counter 310, and delay the address AX<14:2> to output the delayed address ADD<14:2>.

The first F/F 350 may receive the detection signal Rep_En through a first input terminal, and receive the delayed clock PLS4DO through a second input terminal. The first F/F 350 may latch the detection signal Rep_En in response to the delayed clock PLS4DO to output a repair enable signal Rep_enable. For example, the first F/F 350 may be implemented with a D flip-flop.

The second F/F 360 may receive the address ADD<14:2> through a first input terminal, and receive the delayed clock PLS4DO through a second input terminal. The second F/F 360 may latch the address ADD<14:2> in response to the delayed clock PLS4DO to output an output address AX_P<14:2>. For example, the second F/F 360 may be implemented with a D flip-flop.

Referring to FIG. 4A, the address generation device illustrated in FIG. 3A may synchronize a redundancy address or main address with the clock, after evaluating whether a counted address is a repair address or not. That is, after the delayed clock PLS4DO is delayed for a predetermined time, the output address AX_P<14:2> may be outputted. The delay time of the delayed clock PLS4DO may be defined as Equation 1 below.

Address counting time (or address changing time)
$t1$+repair evaluation time $t2$+other times $t3$
(e.g., F/F setup time)     (1)

Figure 3B:
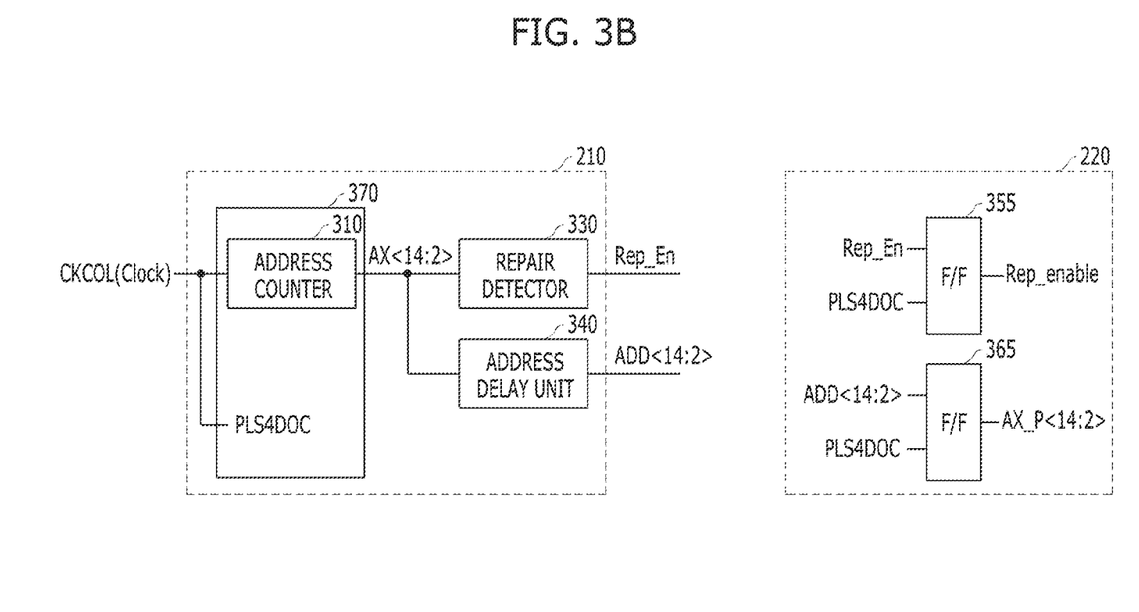
FIG. 3B is a diagram illustrating an address generation device in accordance with an embodiment of the present invention.

FIG. 3B is a diagram illustrating an address generation device in accordance with an embodiment of the present invention. FIG. 3B shows a detailed configuration of the address generation device 200 illustrated in FIG. 2.

Referring to FIG. 3B, the address generator 210 may include an address counter 310, a repair detector 330, and an address delay unit 340, and the synchronizer 220 may include a first F/F 355 and a second F/F 365. The address counter 310, the repair detector 330, and the address delay unit 340 shown in FIG. 3B may have the same configuration as FIG. 3A. That is, as compared to the address generation device shown in FIG. 3A, the clock delay unit 320 is removed from the address generation device shown in FIG. 3B.

The address counter 310 may perform a counting operation in response to a clock CKCOL, and generate an address AX<14:2> corresponding to the counting operation. The clock CKCOL may be used as a source clock PLS4DOC for outputting data stored in the memory device 150 shown in FIG. 1.

The repair detector 330 may receive the address AX<14:2> generated by the address counter 310, and detect (or evaluate) whether the address AX<14:2> is a repair-related address. The repair detector 330 may output the detection result as a detection signal Rep_En.

The address delay unit 340 may receive the address AX<14:2> generated by the address counter 310, and delay the address AX<14:2> to output the delayed address ADD<14:2>.

The first F/F 355 may receive the detection signal Rep_En through a first input terminal, and receive the clock PLS4DOC (or CKCOL) through a second input terminal. The first F/F 355 may latch the detection signal Rep_En in response to the clock PLS4DOC to output a repair enable signal Rep_enable. For example, the first F/F 355 may be implemented with a D flip-flop.

The second F/F 365 may receive the address ADD<14:2> through a first input terminal, and receive the clock PLS4DOC (or CKCOL) through a second input terminal. The second F/F 365 may latch the address ADD<14:2> in response to the clock PLS4DOC to output the latched address as an output address AX_P<14:2>. For example, the second F/F 365 may be implemented with a D flip-flop.

Figure 4B:
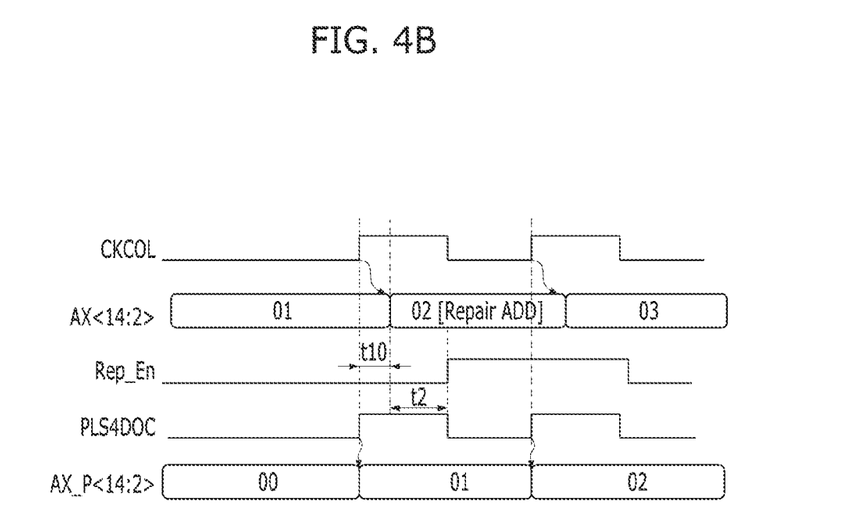
FIG. 4B is a timing diagram for describing an operation of the address generation device shown in FIG. 3B.

Referring to FIG. 4B, the address generation device illustrated FIG. 3B may synchronize an address (e.g., '01') before address counting through the second F/F 365 in consideration of a preset time, at the point in time that an address (e.g., '02') is counted. The preset time may be set to a hold time t10 of the second F/F 365.

The address generation device of FIG. 3B may hide a repair evaluation time t2 needed in the address generation device illustrated in FIG. 3A. That is, the address generation device illustrated in FIG. 3B may count an internal counting address one clock cycle (i.e., 1tCK) earlier. Thus, the address generation device may synchronize a redundancy address or main address with the clock PLS4DOC, before the address is changed to the next address (e.g., 02).

In the address generation device shown in FIG. 3B, the internal address synchronization clock PLS4DOC may have a margin corresponding to the hold time t10 of the second F/F 365 before the internal counting address AX<14:2> is changed, for example, from '00' to '01'. For this operation, the address generation device may hide (address counting time t1+repair evaluation time t2) of FIG. 3A within one cycle (for example, 2tCK) as illustrated in FIG. 3B, and directly provide the internal address synchronization clock PLS4DOC to the second F/F 365 without a delay circuit. That is, the address generation device shown in FIG. 3B may perform the internal address synchronization based on the hold time margin before the address is changed, instead of a setup time margin after the repair evaluation time t2. Thus, the address generation device may hide the repair evaluation time corresponding to the cycle of the address clock. In other words, the address generation device shown in FIG. 3B may reduce the repair evaluation time from the total data out timing budge, thereby minimizing the timing budget.

Figure 5A:
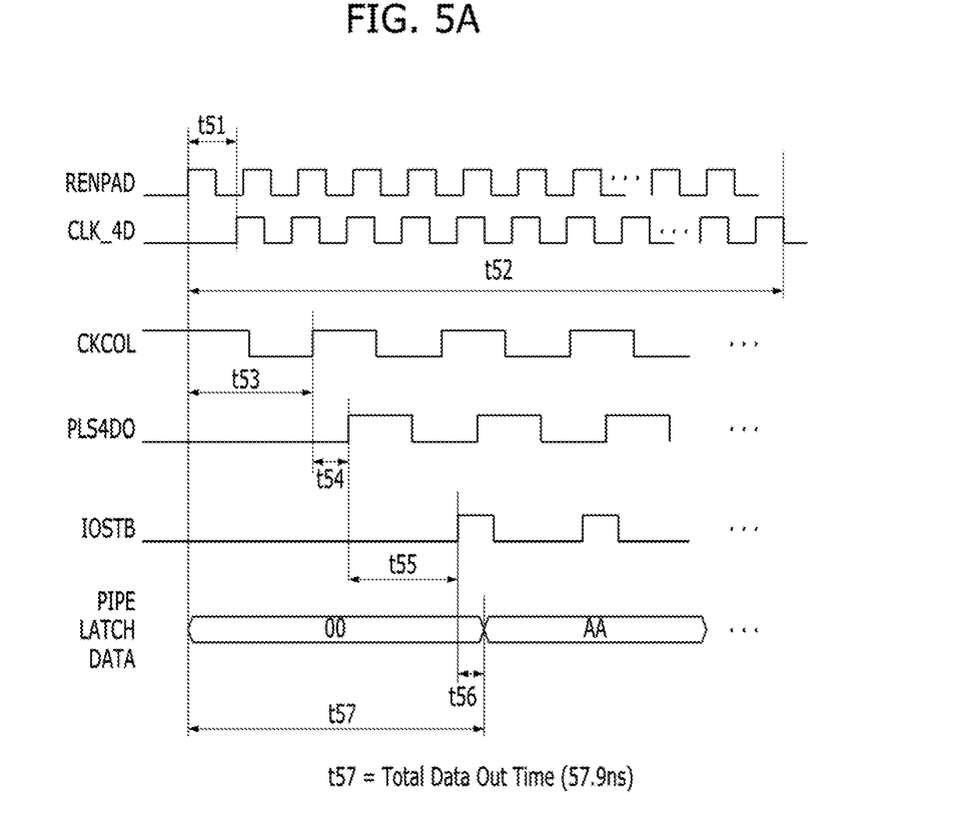
FIG. 5A is a timing diagram for describing a data out timing of the address generation device shown in FIG. 3A.
Figure 5B:
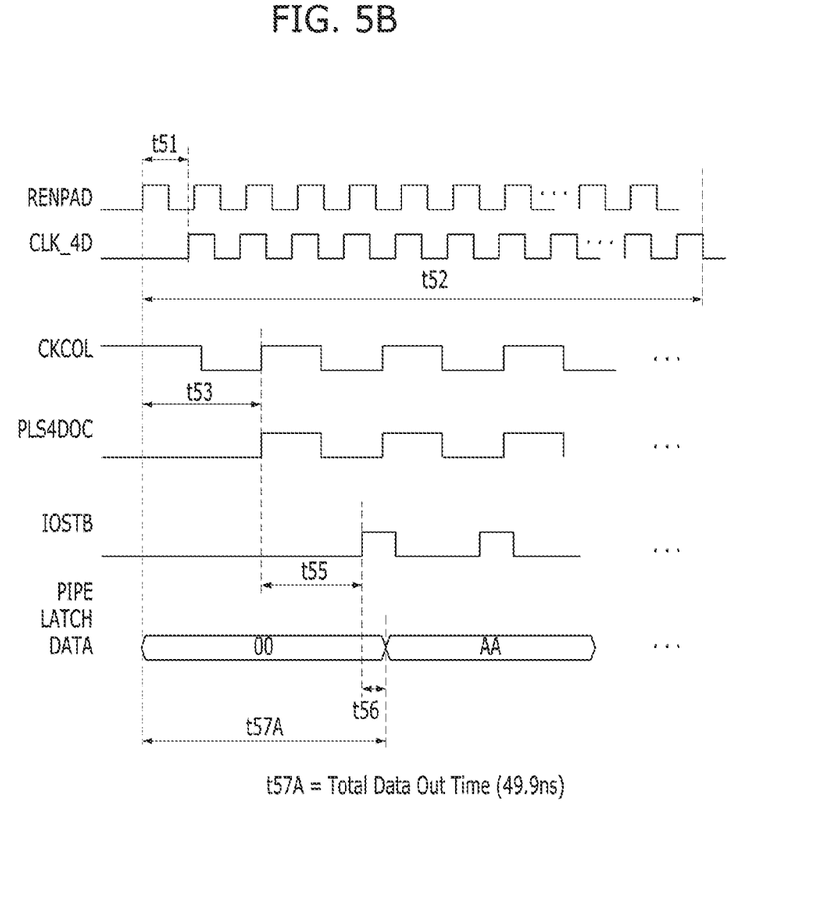
FIG. 5B is a timing diagram for describing a data out timing of the address generation device shown in FIG. 3B.

FIG. 5B is a timing diagram for describing a data out timing the address generation device shown in FIG. 4B. Referring to FIG. 5B, the total data out time t57A (e.g., based on 533 Mbps int. tAC) may be improved by about 8 ns, compared to a data out time t57 of the address generation device in FIG. 5A.

Referring to FIG. 5A, the data out time t57 may be determined by (t53+t54+t55+t56). At this time, t53 may indicate {clock delay t51 (e.g., 15 ns)+1tCK (e.g., 3.75 ns)}, t54 may indicate {address counting time+line and gate delay+repair address timing margin or repair margin (Rep. margin)} (e.g., 16.6 ns), t55 may indicate {line and gate delay+IO line precharge time (loprechb)+data sensing time} (e.g., 14.5 ns), and t56 may indicate {Global Data Line change or pipe latching delay time+line delay+pipe latch transfer time)} (e.g., 8 ns). At this time, t52 may indicate a data path margin. The data path margin (int. tAC) may be set to 58.1 ns (15 ns+11.5*3.75 ns), for example. Thus, the data out time t57 may be set to 57.9 ns.

Referring back to FIG. 5B, the data out time t57A may be determined by (t53+t54A+t55+t56). At this time, t53 may indicate {clock delay t51 (e.g., 15 ns)+1tCK (e.g., 3.75 ns)}, t54A may indicate {line and gate delay+repair address timing margin or repair margin (Rep. margin over 2tCK) (e.g., 7.5 ns)} (e.g., 8.6 ns). The t54A of FIG. 5B may be shorter than the t54 of FIG. 5A by {Address counting time (or address changing time) t1+repair evaluation time t2+other times t3 (e.g., F/F setup time)}. The t55 may indicate {line and gate delay+IO line precharge time (loprechb)+data sensing time)} (e.g., 14.5 ns), and t56 may indicate {GDL change or pipe latching delay time+line delay+pipe latch transfer time)} (e.g., 8 ns). At this time, t52 may indicate a data path margin. For example, the data path margin (int. tAC) may be set to 58.1 ns (15 ns+11.5*3.75 ns). Thus, the data out time t57A may be set to 49.9 ns. The total data out time t57A of the address generation device in accordance with the embodiment of the present invention may be improved by about 8 ns, compared to the data out time t57 illustrated in FIG. 5A. Furthermore, since the data out time margin (e.g., based on 533 Mbps int. tAC) is sufficient, the memory system may not require an additional pipe latch (e.g., one-stage pipe latch).

As described above, the address generation device in accordance with the embodiment of the present invention may synchronize the previous address in a state where the address generation device has the address counter time margin, before the address is changed to the next address. Thus, the address generation device may minimize the operation current and chip size of the internal circuit while operated at high speed according to the trend in which the interface of a memory device such as NAND flash memory is improved in operating speed. For example, as the coupling of the clock delay unit is removed, a current reduction of 0.5 mA may be achieved, and the data out timing budget may be improved by about 8 ns. Furthermore, according to the improvement of the data out time, one or more pipe latches may be omitted.

Although various embodiments have been described for illustrative purposes, it will be apparent to those skilled in the art that various changes and modifications may be made without departing from the spirit and scope of the invention as defined in the following claims.

What is claimed is:

1. An address generation device of a memory system, comprising:
   an address generator suitable for sequentially generating a first address and a second address based on a clock; and
   a synchronizer suitable for synchronizing the first address in response to the clock at a preset point in time before the second address is generated by the address generator to output an output address,
   wherein the synchronizer includes a first flip-flop suitable for latching a third address in response to the clock to output the latched third address as the output address, and
   wherein the preset point in time is set to a hold time of the first flip-flop, the hold time being greater than zero.

2. The address generation device of claim 1, wherein the address generator includes:
   an address unit suitable for generating the first address and the second address in response to the clock;
   an address delay unit suitable for delaying the second address to generate the third address; and
   a repair detector suitable for detecting whether the second address is a repair address to generate a detection signal.

3. The address generation device of claim 2, wherein the synchronizer further includes a second flip-flop suitable for latching the detection signal in response to the clock to output a repair enable signal.

4. The address generation device of claim 1, wherein the clock includes a source clock for data output of the memory system.

5. The address generation device of claim 1, wherein the first flip-flop includes a D flip-flop.

6. A method for generating an address in a memory system, the method comprising:
   sequentially generating a first address and a second address based on a clock; and
   synchronizing the first address in response to the clock at a preset point in time before the second address is generated to output an output address,
   wherein the preset point in time is set to a hold time of a flip-flop used for the synchronizing of the first address, the hold time being greater than zero.

7. The method of claim 6, further comprising:
   delaying the second address to generate a third address; and
   detecting whether the second address is a repair address.

8. The address generation method of claim 7, further comprising outputting a repair enable signal corresponding to a result of the detecting.

9. The address generation method of claim 6, wherein the clock includes a source clock for data output of the memory system.

10. A memory system comprising:
    a memory device storing data and including an address generation device suitable for generating an address for outputting the stored data; and
    a controller suitable for controlling an operation of the memory device, and supplying a clock to the memory device;
    wherein the address generation device comprises:
      an address generator sequentially generating a first address and a second address based on the clock; and
      a synchronizer suitable for synchronizing the first address in response to the clock at a preset point in time before the second address is generated by the address generator to output an output address,
      wherein the synchronizer includes a first flip-flop suitable for latching a third address in response to the clock to output the latched third address as the output address, and
      wherein the preset point in time is set to a hold time of the first flip-flop, the hold time being greater than zero.

11. The memory system of claim 10, wherein the address generator includes:
    an address unit suitable for generating the first address and the second address in response to the clock;
    an address delay unit suitable for delaying the second address to generate the third address; and
    a repair detector suitable for detecting whether the second address is a repair address to generate a detection signal.

12. The memory system of claim 11, further comprising a second flip-flop suitable for latching the detection signal in response to the clock to output a repair enable signal.

13. The memory system of claim 12, wherein the first flip-flop includes a D flip-flop.

* * * * *